United States Patent [19]
Byatt

[11] Patent Number: 5,429,953
[45] Date of Patent: Jul. 4, 1995

[54] METHOD OF FORMING SOLID STATE SUPPRESSORS WITH CONCAVE AND DIFFUSED SUBSTITUTION REGIONS

[75] Inventor: Stephen W. Byatt, Bromham, United Kingdom

[73] Assignee: Texas Instruments Incorporated, Dallas, Tex.

[21] Appl. No.: 75,656

[22] Filed: Jun. 11, 1993

[30] Foreign Application Priority Data

Jul. 15, 1992 [GB] United Kingdom ............... 9215017

[51] Int. Cl.⁶ ............................................. H01L 49/00
[52] U.S. Cl. ........................................ 437/6; 257/109; 257/110
[58] Field of Search ................. 437/6; 257/109, 110, 257/111, 112, 40

[56] References Cited

U.S. PATENT DOCUMENTS

| | | | |
|---|---|---|---|
| 4,760,439 | 7/1988 | Borkowicz | 257/110 |
| 4,797,720 | 1/1989 | Lindner et al. | 257/110 |

FOREIGN PATENT DOCUMENTS

| | | | |
|---|---|---|---|
| 0262485 | 4/1988 | European Pat. Off. | |
| 0394859 | 10/1990 | European Pat. Off. | 257/110 |
| 887 | 1/1979 | Japan | 257/110 |
| 2208257 | 3/1989 | United Kingdom | |

OTHER PUBLICATIONS

Patent Abstracts of Japan, vol. 7, No. 45 (E-160) (1190) 23 Feb. 1983 & JP-A-57 196 569 (Tokyo Shibaura Denki K.K.) 2 Dec. 1992 * abstract *.
Patent Abstracts of Japan, vol. 4, No. 181 (E-37) 13 Dec. 1980 & JP-A-55 124 262 (Miitsubishi Electric Corp) 25 Sep. 1980 * abstract *.
Patent Abstracts of Japan, vol. 10, No. 359 (E-460) (2416) 3 Dec. 1986 & JP-A-61 158 179 (Toshiba Corp) 17 Jul. 1986 * abstract *.
Patent Abstracts of Japan, vol. 5, No. 141 (E-73) (813) 5 Sep. 1981 & JP-A-56 076 568 (Mitsubishi Denki K.K.) 24 Jun. 1981 * abstract *.
Patent Abstracts of Japan, vol. 11, No. 254 (E-533) 18 Aug. 1987 & JP-A-62 063 472 (Sharp Corp) 20 Mar. 1987 * abstract *.

*Primary Examiner*—Brian E. Hearn
*Assistant Examiner*—Lynne A. Gurley
*Attorney, Agent, or Firm*—Russell E. Baumann; Richard L. Donaldson; René E. Grossman

[57] ABSTRACT

This invention relates to an improved solid state suppressor and a method for making the same. Due to the fact that at least part of the substrate is substituted during fabrication of the suppressor, it is possible to produce a suppressor having a substrate which has an effective thickness that is less than the physical thickness of the slice. This allows for a good functioning suppressor which is unlikely to break during fabrication.

8 Claims, 5 Drawing Sheets

METHOD OF FORMING SOLID STATE SUPPRESSORS WITH CONCAVE AND DIFFUSED SUBSTITUTION REGIONS

BACKGROUND OF THE INVENTION

This invention relates to solid state suppressors for suppressing transients and the like, particularly, but not exclusively, at low temperatures.

It is known to provide transient suppressors for protecting all types of equipment, for example, Telecommunications equipment. The suppressors can be based on a thyristor structure which is capable of suppressing high voltages and thereby diverting any surge currents from the equipment.

The following description describes a thyristor structure based on an N-type starting material. Complementary versions of this structure starting with a P-type material are also applicable. A similar description would apply with the interchange of "N" and "P" labels. Additionally, the use of the term N− generally refers to an N-type material that is lightly doped and N+ generally refers to an N-type material that is heavily doped as is known in the art.

FIG. 1 shows a typical prior art bi-directional transient suppressor in the form of a thyristor. These devices typically have the following dimensions, 100 mil × 100 mil, and are fabricated as an array of columns and rows of devices on a single silicon slice. Due to the dimensions of the slice, it is necessary for the silicon to be about 10 mil thick to support the devices and to be sufficiently durable to survive the manufacturing process.

The breakdown voltage of the thyristor is determined by the structure and the conductivity levels of the P-type and N− type base regions. The conductivity of the N− type base region usually has the most significant influence on the breakdown voltage. As this region is formed from the slice starting material, some manufacturers select the start material conductivity to set the breakdown voltage. Alternatively, the slice conductivity may be chosen to give a higher breakdown voltage than required. The breakdown voltage is then reduced to the required level by selectively diffusing regions of higher N type conductivity into the N− type base region immediately adjacent to the P-type base layer. Although the discussion details the N type diffusion method of setting the breakdown voltage, the performance improvements described are equally applicable to the other voltage setting techniques.

From a design point of view, the N− diffusion region for each half of the thyristor is used to set the breakdown voltage of the suppressor. A typical breakdown voltage would be in the range of 18 to 350 volts. Accordingly, the N− diffusion region need only be about 1.5 mil to support this voltage and the reverse bias depletion layer. In addition, the P type junctions need only be made to be about 1–2 mil deep to accommodate passivation requirements. Ideally, therefore, the device should be made on a slice having a thickness of about 5 mil. Clearly this has not been practical, since a slice of this thickness is not sufficiently durable to survive the manufacturing process. This results in the use of a thicker slice for the manufacture of thyristor devices which means that the N− region is generally larger (thicker) than necessary. The use of a thickness greater than necessary for the N− region has the drawback that the on-state voltage is increased and the switching speed is slower than for a thyristor structure with the minimum N− region thickness. These drawbacks lead to increased power dissipation under surge conditions and reduced maximum surge rating. In addition, the thick N− region offers a high resistance until the region is conductivity modulated by injected carriers from the emitter. This can cause high transient voltages to appear across the device before full protection can be established. These transients can cause damage to the circuitry being protected.

It has been proposed to overcome the disadvantages of the above present system by using a thick P+ substrate for the anode and growing the N− layer epitaxially. This type of structure, however, will only conduct in one direction and two separate structures are required if transient protection is required with both polarities. This is both costly and inconvenient.

SUMMARY OF THE INVENTION

One object of the present invention is to provide a structure with improved operating characteristics and switching speed especially useful for low temperature applications.

According to one aspect of the present invention, there is provided a thyristor device having a substrate of material of a first conductivity type, wherein at least part of the substrate is substituted with a material of a second conductivity type during fabrication of the device.

This has the advantage that the N− substrate layer is effectively relatively thin for the purpose of providing a carrier flow path while providing the necessary thickness required for fabrication purposes.

Such a thyristor may be incorporated into a transient suppressor such as, for example, the type used in Telecommunication applications.

According to a second aspect of the present invention, there is provided a method of producing a thyristor device, comprising the steps of:

taking a substrate having top surface and a bottom surface with two edge surfaces of material of a first conductivity type;

forming a substitution region in the substrate on said bottom or said top surface;

forming a first diffusion region of said material of first conductivity type in said substrate on the opposite surface to said substration region;

forming second and third diffusion regions of a material of a second conductivity type on said top surface and said bottom surface of the substrate; and forming a fourth diffusion region of said material of first conductivity type in one of said second and third diffusion regions and on the same surface side as the first diffusion region.

According to yet another aspect of the present invention, there is provided a method of producing the thyristor device above in which a fifth diffusion region of said material of second conductivity type on the edge of said substrate is used to provide isolation diffusion areas which ensures that all the passivated junctions are on the top surface of the device.

BRIEF DESCRIPTION OF THE DRAWINGS

Reference will now be made, by way of example, to the accompanying drawings in which.

DETAILED DESCRIPTION OF THE DRAWINGS

Figure 1:
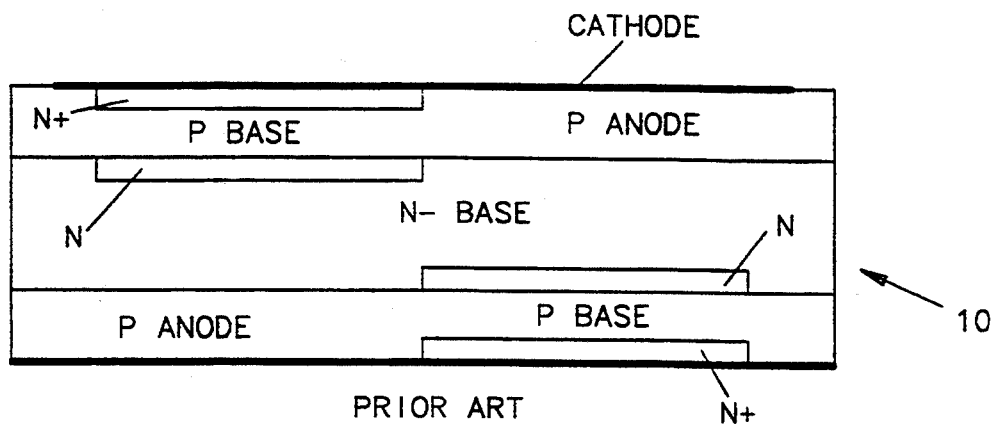
FIG. 1 is a cross-sectional diagram for showing the basic structure of a bi-directional transient suppressor.
Figure 2A:
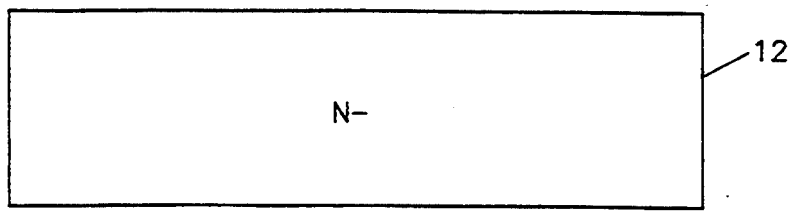
FIGS. 2A–2I are cross-sectional diagrams to illustrate the fabrication of a transient suppressor according to one aspect of the present invention.
Figure 2B:
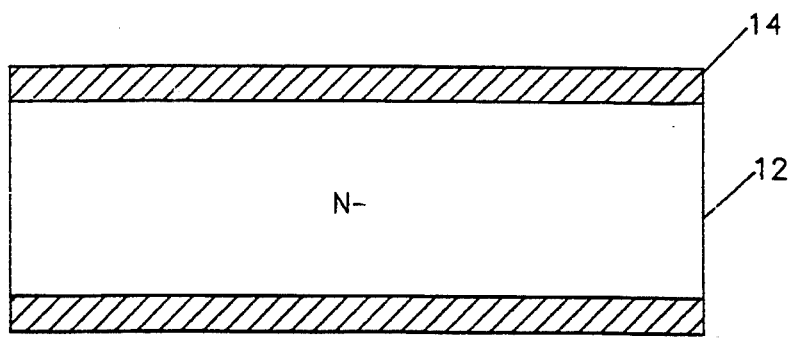

Referring to FIG. 1, a bi-directional transient suppressor is shown generally at 10. This thyristor structure disclosed in the prior art (FIG. 1) forms the basis of the thyristor device forming the transient suppressor, The device, according to the present invention, may be fabricated in the following way as illustrated in FIGS. 2A–2I:

An N− type silicon slice (first conductivity type) is shown generally at 12 (see FIG. 2A). The slice is typically 10 mil thick at the start of the production process to provide for suitable structural strength. The slice is oxidized in the normal manner and a layer of oxide 14 is produced (see FIG. 2B).

Figure 2C:
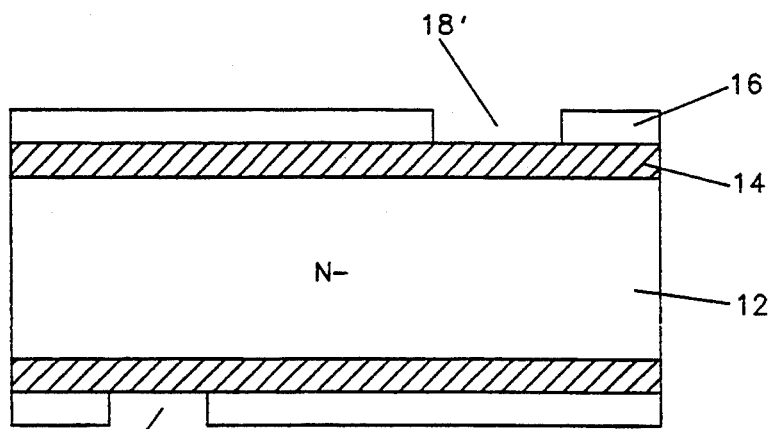
Figure 2D:
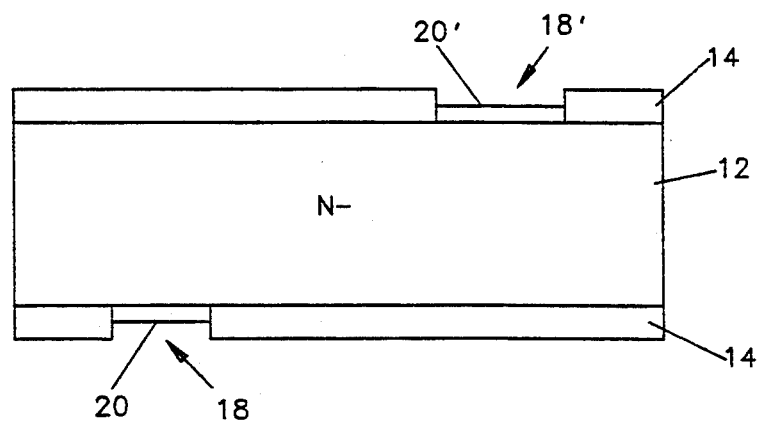
Figure 2E:
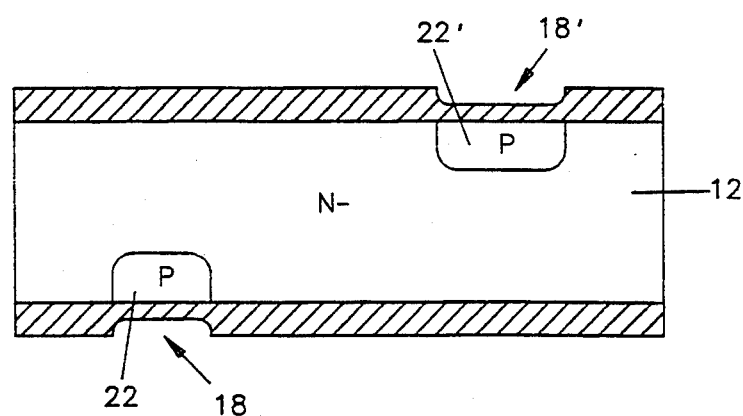
Figure 2F:
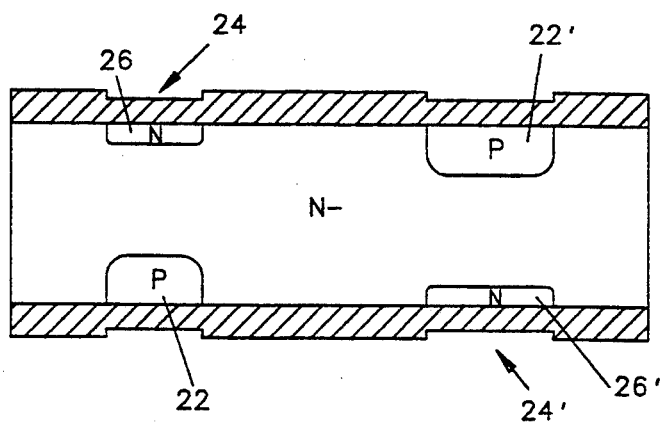
Figure 2G:
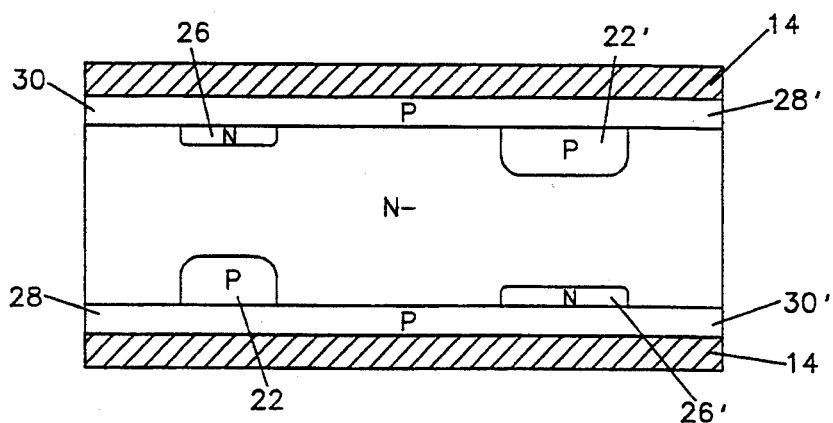
Figure 2H:
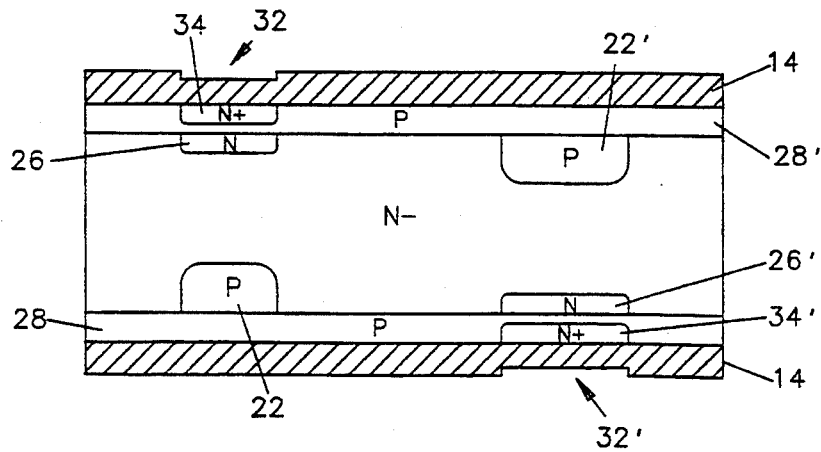

Referring to FIG. 2C, a layer of photoresist 16 is applied to the oxide layer. A photo mask (not shown) is positioned over the photoresist and exposed to UV light. Where the light passes through the mask, the photoresist becomes insoluble. The soluble portions of the mask (unexposed to UV light) are then dissolved leaving the structure of FIG. 2C. The oxide in areas 18, 18′ which are not protected by photoresist are removed using an appropriate material as is known in the art; for example, a saturated aqueous solution of ammonium fluoride. The exposed photoresist is then removed leaving the structure shown in FIG. 2D. Boron, shown at 20, 20′, is then deposited onto the surface of the slice 12. The Boron is driven into the silicon in a diffusion process such that two deep anodes 22, 22′ are produced in the substrate thereby reducing the effective N− thickness at this point of the substrate. The oxidation layer is built up again during the diffusion process, such that areas 18, 18′ are recovered with oxide (see FIG. 2E).

The photolithograph process described above is repeated to produce exposed silicon in areas 24 and 24′. Phosphorus is implanted into the silicon in these areas and diffused into the slice in a second diffusion process thereby producing the N diffusion regions (first conductivity type) 26, 26′ (see FIG. 2F).

The oxide layer is then completely removed using a further photolithographic procedure. Boron is implanted into the silicon and diffused as above to form P anode (second conductivity type) regions 28, 28′ and P (second conductivity type) base regions 30, 30′ (see FIG. 2G).

An area 32, 32′ of the slice is then exposed by another photolithographic procedure and phosphorus is deposited thereon. A further diffusion process produces N+ (first conductivity type) emitter regions 34, 34′ (see FIG. 2H).

The contacts (not shown) are then applied by a photolithographic process and an oxide etch. Metallization 36, 36′ is applied by evaporating a suitable metal onto the surface of the structure. A still further photolithographic process is used to define the metal patterns.

Figure 2I:
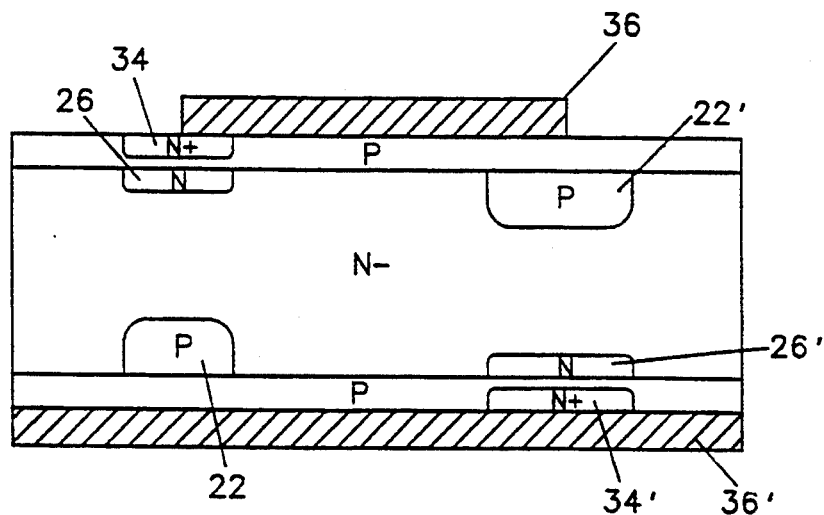

Clearly, each half of the bi-directional transient suppressor shown in FIG. 2I is processed in an opposite respect to enable the required device to be fabricated. For example, in one half of the suppressor the deep anode 22 is diffused into the bottom surface of the slice, and in the other half of the suppressor the deep anode 22′ is diffused into the top surface of the slice.

Figure 3:
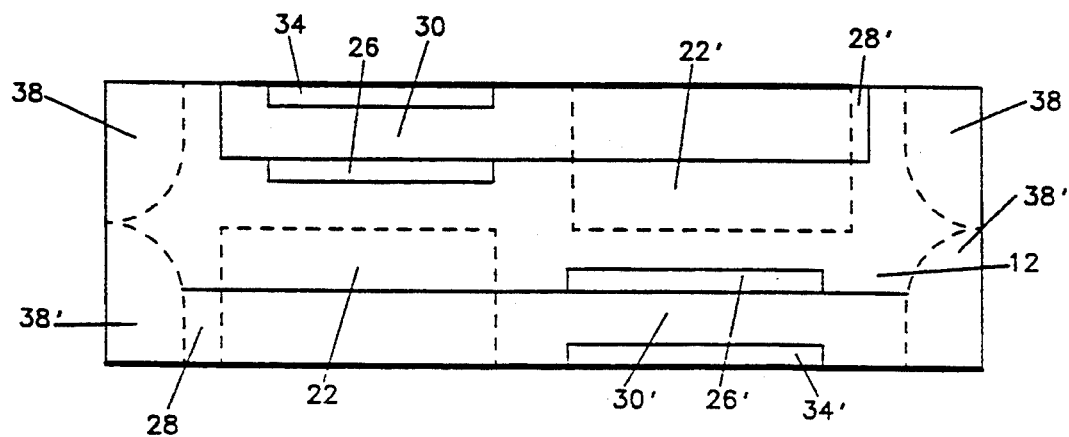
FIG. 3 is a cross-sectional diagram of a transient suppressor according to a second aspect of the present invention.

The deep anode structure or any equivalent over-doped region allows a thin N− base to be realized with a thicker slice. FIG. 2I shows the deep anode within the thyristor transient suppressor. Certain designs of transient suppressor require the use of isolation diffusions 38 and 38′ which ensures that all the passivated junctions are on the top surface of the device as shown in FIG. 3. In this case, the deep anode diffusion may be conveniently incorporated into the device in combination with providing for the isolation diffusion. The deep anode areas may be produced by oxide masking. Boron is deposited into the oxide windows and diffused into the silicon to the required depth. The longer time taken for diffusion, the deeper the depth of the deep anode. Other methods other than this may be used as an alternative.

The benefits of the deep anode structure which reduces the effective thickness of the carrier flow path in the substrate becomes increasingly apparent at low temperatures. This is important when transient suppressors are used in remote applications where the temperature can fall to −40° C. At these low temperatures, the turn on time for a transient suppressor of present prior art designs would be about 25 microseconds. The same device with the deep anode regions is "turned on" at about 3 microseconds.

Surge capability is also improved at low temperatures. A transient suppressor using the deep anode process could withstand 100A with a 10/1000us surge test whereas conventional devices failed at 50A.

Still further, when a fast rising voltage pulse is applied to a transient suppressor, there will be some over-shoot above the normal breakdown voltage before the device starts to conduct. With a ramp rate of 10 kV/us, a device with the deep anode limits the overshoot to 15 V, whereas the standard thyristor structure may over-shoot by over 100 V, to the detriment of the circuitry being protected.

Figure 4:
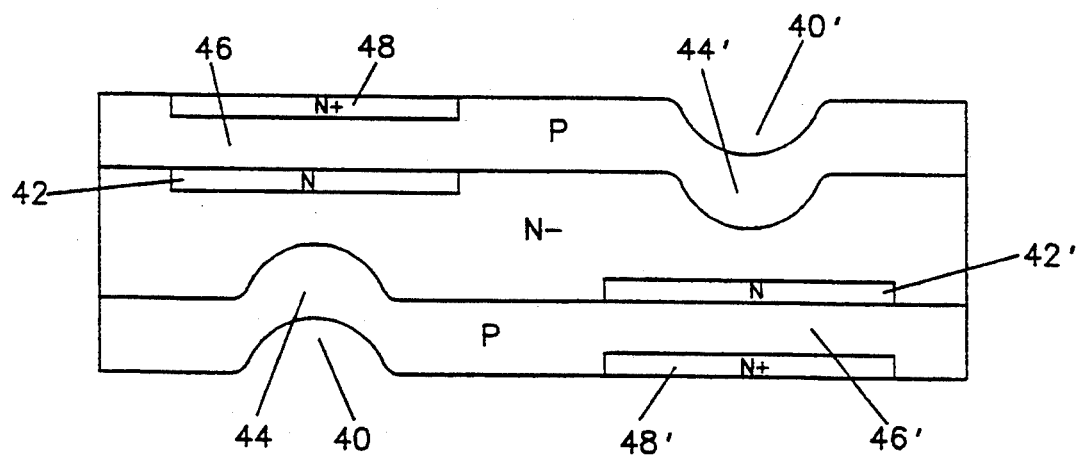
FIG. 4 is a cross-sectional diagram of a transient suppressor according to a third aspect of the present invention.

FIG. 4 shows yet another embodiment of the invention to provide for the effect of the deep anode in which the effective thickness of electron flow path is reduced to the desired amount. A "well" or other type of concavity 40, 40′ is etched into the silicon slice 12 to produce a substitution region replacing the initial material of silicon slice 12. The N diffusion layers 42, 42′, the P anodes 44, 44′, P bases 46, 46′ and N+ emitter layers 48, 48′ are introduced into the thyristor structure as described above. In certain applications, the use of the "well" in the substrate may do away with the need for deep P anode. However, a combination of etching a well and deep P diffusion may be appropriate as required. When the thickness of the N− slice is reduced, the on state voltage is also reduced and the speed of switching of the device is increased. In circumstances when the "well" is etched in the silicon and a P layer (not shown) may be deeply diffused into the slice, the thickness of the N− base is then further reduced. Generally, fabrication of the device including a "well", is similar to that described with reference to FIGS. 2A-2I.

It will be appreciated that other means of reducing the effective thickness of the N− base may be appropriate in certain circumstances.

Figure 5:
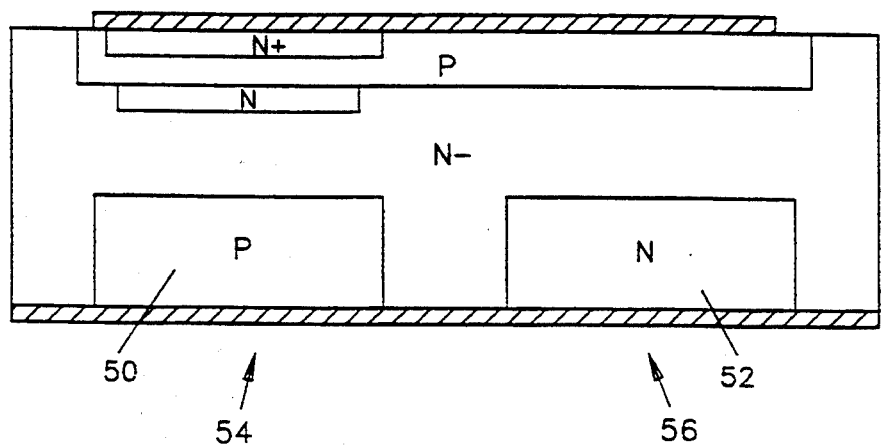
FIG. 5 is a cross-sectional diagram of a transient suppressor according to a fourth aspect of the present invention.

Referring to FIG. 5, the transient suppressor in this case includes a deep anode 50 and a deep cathode 52, resulting in a thyristor 54 and a diode 56 respectively. In certain circumstances, use of this form of suppressor may be appropriate. The thyristor part of the suppressor is fabricated in a similar manner to that described for the bi-directional suppressor above while the diode part of the suppressor is fabricated in a similar manner, but the different regions are diffused at different times in the process and at different locations.

The devices shown are all bi-directional, however, unidirectional devices are equally as appropriate for particular applications.

The transient suppressor is suitable for use in many applications. One particular application, however, is in telecommunication systems and the like.

I claim:

1. A method of producing a thyristor device, comprising the steps of:
    taking a substrate having top surface and a bottom surface and two side edge surfaces of material of a first conductivity type, said substrate having a thickness and a defined carrier flow path for said thickness;
    forming a substitution region consisting of a concavity in the substrate on said bottom or said top surface to thereby reduce the effective thickness of the electron carrier flow path of the substrate of the material of first conductivity type;
    forming a first diffusion region of said material of first conductivity type in said substrate directly across from said substitution region;
    forming second and third diffusion regions of a material of a second conductivity type on said top surface and said bottom surface of the substrate; and
    forming a fourth diffusion region of said material of first conductivity type in one of said second and third diffusion regions and on the same surface side as the first diffusion region.

2. A method of claim 1 wherein the effective thickness of the carrier flow path of the substrate of the material of first conductivity type is less than 10 mills.

3. A method according to claim 1 wherein said step of forming a substitution region comprises forming a fifth diffusion region of said material of second conductivity type on said two edge surfaces.

4. A method of claim 1 wherein said material of first conductivity type is N type material and said material of second conductivity type is P type material.

5. A method of producing a thyristor device, comprising the steps of:
    taking a substrate having top surface and a bottom surface and two side edge surfaces of material of a first conductivity type, said substrate having a thickness and a defined carrier flow path for said thickness;
    forming a substitution region consisting of a region of the material of a second conductivity type and a concavity in the substrate on said bottom or said top surface to thereby reduce the effective thickness of the electron carrier flow path of the substrate of the material of first conductivity type;
    forming a first diffusion region of said material of first conductivity type in said substrate directly across from said substitution region;
    forming second and third diffusion regions of a material of the second conductivity type on said top surface and said bottom surface of the substrate; and
    forming a fourth diffusion region of said material of first conductivity type in one of said second and third diffusion regions and on the same surface side as the first diffusion region.

6. A method of claim 5 wherein the effective thickness of the carrier flow path of the substrate of the material of first conductivity type is less than 10 mills.

7. A method according to claim 5 wherein said step of forming a substitution region comprises forming a fifth diffusion region of said material of second conductivity type on said two side edge surfaces.

8. A method of claim 5 wherein said material of first conductivity type is N type material and said material of second conductivity type is P type material.

* * * * *